(12) United States Patent
Hanson et al.

(10) Patent No.: US 6,608,714 B2
(45) Date of Patent: Aug. 19, 2003

(54) BI-DIRECTIONAL, SINGLE MATERIAL THERMAL ACTUATOR

(75) Inventors: Heather Shannon Hanson, San Antonio, TX (US); Joseph Nathan Mitchell, San Antonio, TX (US)

(73) Assignee: Southwest Research Institute, San Antonio, TX (US)

( * ) Notice: Subject to any disclaimer, the term of this patent is extended or adjusted under 35 U.S.C. 154(b) by 0 days.

(21) Appl. No.: 09/892,616

(22) Filed: Jun. 28, 2001

(65) Prior Publication Data

US 2003/0002133 A1 Jan. 2, 2003

(51) Int. Cl.[7] .............................................. G02B 26/00
(52) U.S. Cl. ...................... 359/296; 359/288; 359/290
(58) Field of Search ................................. 359/296, 291, 359/290, 298, 288, 221–224, 820, 846, 848; 313/151; 109/33

(56) References Cited

U.S. PATENT DOCUMENTS 5,870,007 A * 2/1999 Carr et al. .................. 333/262
6,428,173 B1 * 8/2002 Dhuler et al. ............... 359/872
6,438,954 B1 * 8/2002 Goetz et al. ................. 60/527

OTHER PUBLICATIONS

Wen–Chih Chen, Jerwei Hsieh, and Weileun Fang, "A Novel Single layer bi–directional out–of–plane Electrothermal Microactuator", Published Jan. 2002 in Micro Electro Mechanical Systems, 2002. The Fifteenth International Conference on pp. 693–697.*

Martin Huja and Miroslav Husak, "Thermal Microactuators for Optical Purpose", Published in Apr., 2001 in Information Technology:Coding and Computing, 2001 Proceedings.*

Hergen Kapels, Robert Aigner, and Josef Binder, "Fracture Strength and Fatique of Polysilicon Determined by a Novel Thermal Actuator", Published Jul. 2000 in Electron Devices, IEEE Transactions on pp. 1522–1528, vol. 47, Issue 7.*

* cited by examiner

Primary Examiner—Jordan M. Schwartz
Assistant Examiner—Jessica T. Stultz
(74) Attorney, Agent, or Firm—Oliff & Berridge, PLC

(57) ABSTRACT

A thermal actuator includes a first arm having a proximal end and a distal end, a second arm, parallel to the first arm, having a proximal end and a distal end, and a third arm arranged between and parallel to the first and second arms, the third arm having a proximal end and a distal end. The third arm has at least one portion at the distal end of the third arm having a width that is substantially larger than a width of the first arm and a width of the second arm. The distal ends of the first, second and third arms are coupled together to form a distal end of the thermal actuator, and the first, second and third arms preferably are made of a single material. A number of thermal actuators can be arranged in an array. The thermal actuator or array of thermal actuators can be coupled to an applicator.

18 Claims, 3 Drawing Sheets

BI-DIRECTIONAL, SINGLE MATERIAL THERMAL ACTUATOR

BACKGROUND OF THE INVENTION

1. Field of Invention

The invention relates to microelectromechanical structures (MEMS). In particular, this invention relates to bi-directional thermal actuators made using MEMS technology.

2. Description of Related Art

MEMS devices and other microengineered devices are presently being developed for a wide variety of applications in view of the size, cost and reliability advantages provided by these devices. Many different varieties of MEMS devices have been created that are capable of motion or applying force, including, for example, microgears and micromotors. These MEMS devices can be employed in a variety of applications including hydraulic applications in which MEMS pumps or valves are used and optical applications that include MEMS light valves and shutters.

The manipulation of micromachined structures for applications such as microassembly is a delicate task handled best by on-chip devices. One such device, known as a horizontal thermal actuator (HTA), can be used to physically move other parts on or off chip. FIG. 1 shows a conventional HTA 1000. The HTA 1000 is formed on an insulated substrate (not shown), typically a nitride insulated silicon substrate, and includes a first cantilever beam 1120, a first anchor 1130, a second cantilever beam 1150 and a second anchor 1160. The first anchor 1130 anchors the first cantilever beam 1120 to the substrate at a proximal end 1122 of the first cantilever beam 1120. The first cantilever beam 1120 has a distal end 1127. The second anchor 1160 anchors the second cantilever beam 1150 to the substrate at a proximal end 1152 of the second cantilever beam 1150. The second cantilever beam 1150 has a distal end 1157. The first cantilever beam 1120 has a portion 1125 that is wider than the second cantilever beam 1150. The distal end 1127 of the first cantilever beam 1120 is coupled to the distal end 1157 of the second cantilever beam 1150. The first cantilever beam 1120 is electrically connected to ground at the proximal end 1122 of the first cantilever beam 1120 and the second cantilever beam 1150 is electrically connected to a current source 1170 at the proximal end 1152 of the second cantilever beam 1150. The first cantilever beam 1120 is made from the same material as the second cantilever beam 1150.

In operation, current is applied by the current source 1170 to the second cantilever beam 1150. The current applied by the current source 1170 causes the second cantilever beam 1150 to heat up. The first cantilever beam 1120 also heats up very slightly, but only insignificantly. The second cantilever beam 1150, being of smaller width than the first cantilever beam 1120, has a higher current density than the first cantilever beam 1120. The higher current density in the second cantilever beam 1150 causes the temperature of the second cantilever beam 1150 to increase much more rapidly than the first cantilever beam 1120 (thus, beam 1120 is referred to as a "cold arm", whereas beam 1150 is referred to as a "hot arm"). Thus, beam 1150 heats up much faster than beam 1120, which, in turn, causes the second cantilever beam 1150 to longitudinally expand relative to beam 1120, and therefore move toward the first cantilever beam 1120. As a result, the coupled ends 1127 and 1157 of the first cantilever beam 1120 and the second cantilever beam 1150 move in the direction of arrow A. When the current supplied by the current source 1170 is removed, the second cantilever beam 1150 quickly cools and returns to its original position, unless another object prevents it from moving back.

The conventional HTA is reliable and typically requires less than 5 volts, making it CMOS compatible. However, it can exert force in only one direction. In many applications, it is desirable to exert force in two opposite directions. In order to exert force in opposite directions, one could provide a first set of one or more HTAs that operate in a first direction, and a second set of one or more HTAs that operate in a second, opposite direction. However, this doubles the overall size and amount of material required. In addition, bi-directional actuators have been developed that use two different materials and multiple layers having different coefficients of thermal expansion, but such devices have exhibited bending in the off state. Further, the manufacturing process for these devices is cumbersome because of the need to accommodate two different types of materials.

SUMMARY OF THE INVENTION

One aspect of this invention provides a thermal actuator that can apply force to an object in two directions without using two different materials having different coefficients of thermal expansion.

Another aspect of this invention provides a bi-directional thermal actuator which can be incorporated into an array of such actuators to apply force in two directions without sacrificing valuable chip space.

Another aspect of this invention provides a bi-directional actuator that is easily manufactured.

The bi-directional actuator includes first and second "hot" arms (instead of a single "hot" arm), and a third arm, which is the "cold" arm. The bi-directional actuator preferably is made of a single material, for example, polysilicon, using a MEMS process such as, for example, surface micromachining.

According to one embodiment, a bi-directional actuator includes first, second and third arms, each being parallel to each other, and each having distal and proximal ends. The third arm is arranged between the first and second arms. The third arm has at least one portion between its proximal and distal ends with an in-plane width that is wider than an in-plane width of each of the first and second arms. The distal ends of the first, second and third arms are coupled together to form a distal end of the bi-directional thermal actuator. The proximal end of the third arm can be connected to ground, whereas the proximal ends of the first and second arms selectively have current applied thereto. The first, second and third arms preferably are made of the same material. When current is applied to the first arm, the distal end of the thermal actuator moves and applies force in a first direction. When current is applied to the second arm, the distal end of the thermal actuator moves and applies force in a direction opposite to the first direction.

These and other features and advantages of this invention are described in, or are apparent from, the following detailed description of various exemplary embodiments of the systems and methods according to this invention.

BRIEF DESCRIPTION OF THE DRAWINGS

Various exemplary embodiments of this invention will be described in detail, with reference to the following figures, wherein.

DETAILED DESCRIPTION OF PREFERRED EMBODIMENTS

Figure 1:
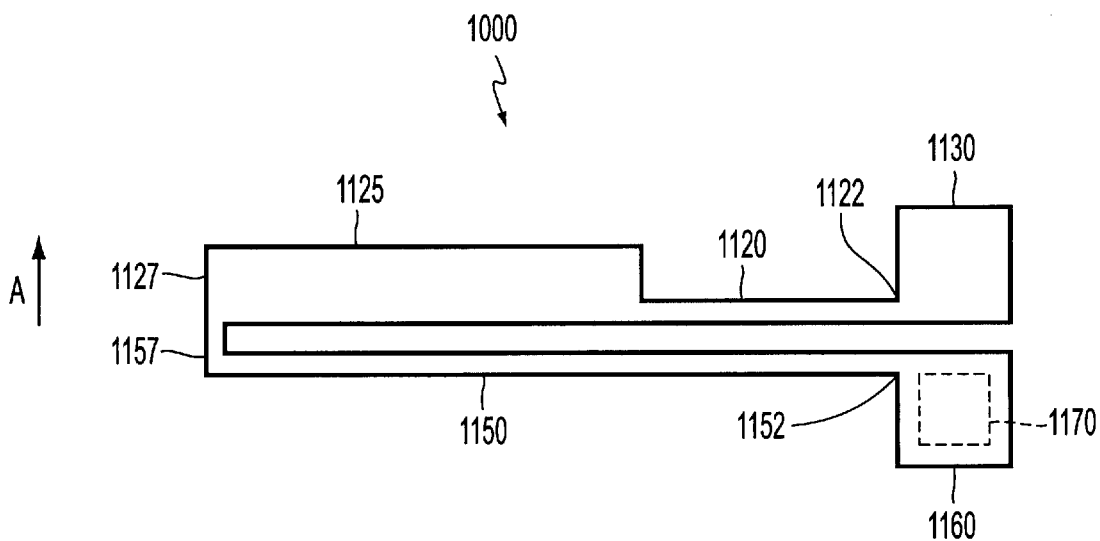
FIG. 1 shows a conventional thermal actuator.
Figure 2:
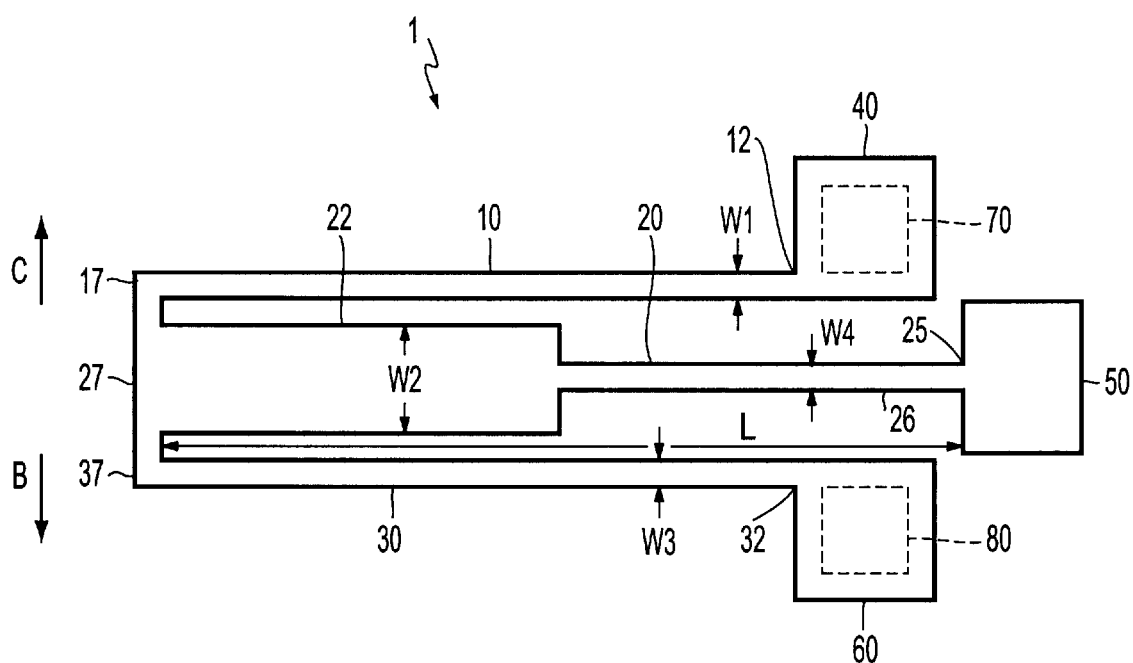
FIG. 2 shows a first exemplary embodiment of a bi-directional, single material thermal actuator according to this invention.

FIG. 2 shows one exemplary embodiment of a bi-directional, single material thermal actuator 1 according to this invention. The thermal actuator 1 is formed on an insulated substrate (not shown), such as a nitride insulated, silicon substrate using known photolithographic techniques. Actuator 1 includes a first cantilever beam 10, a first anchor 40, a first current source 70, a second cantilever beam 20, a second anchor 50, a third cantilever beam 30, a third anchor 60, and a second current source 80. The first anchor 40 anchors the first cantilever beam 10 to the substrate, or any other support, at a proximal end 12 of the first cantilever beam 10. The first cantilever beam 10 has a distal end 17. The second anchor 50 anchors the second cantilever beam 20 to the substrate/support at a proximal end 25 of the second cantilever beam 20. The second cantilever beam 20 has a distal end 27. The third anchor 60 anchors the third cantilever beam 30 to the substrate/support at proximal end 32 of the third cantilever beam 30. The third cantilever beam 30 has a distal end 37. The distal end 17 of the first cantilever beam 10, the distal end 27 of the second cantilever beam 20 and the distal end 37 of the third cantilever beam 30 are coupled together. (Preferably, the entire device (except for the current source) is made from a single layer of one material and forms a unitary structure.) The second cantilever beam 20 has a portion 22 having a width W2 that is substantially wider than the width W1 of the first cantilever beam 10 and the width W3 of the third cantilever beam 30. The second cantilever beam 20 also has a portion 26 having a width W4. The widths W1, W3 and W4 typically are equal to each other, but could differ. The values for W1, W3 and W4 can be, for example, $\mu\mu2$–4 $\mu$m, preferably 2.5–3.0 $\mu$m. The value for W2 can be, for example, 10–18 $\mu$m, preferably 14–15 $\mu$m.

In other embodiments, the second cantilever beam 20 could have a portion having a thickness that is substantially larger than the thickness of the first cantilever beam 10 and the thickness of the third cantilever beam 30.

The first cantilever beam 10 is electrically connected to the first current source 70 at the proximal end 12 of the first cantilever beam 10. The second cantilever beam 20 is electrically connected to ground at the proximal end 25 of the second cantilever beam 20. The third cantilever beam 30 is electrically connected to the second current source 80 at the proximal end 32 of the third cantilever beam 30. Of course, a single current source can be alternately connected to the proximal ends 12 and 13 of beams 10 and 30. The first cantilever beam 10, the second cantilever beam 20, and the third cantilever beam 30 are made of the same material, which can be any suitable material, such as, for example, polysilicon.

Figure 3:
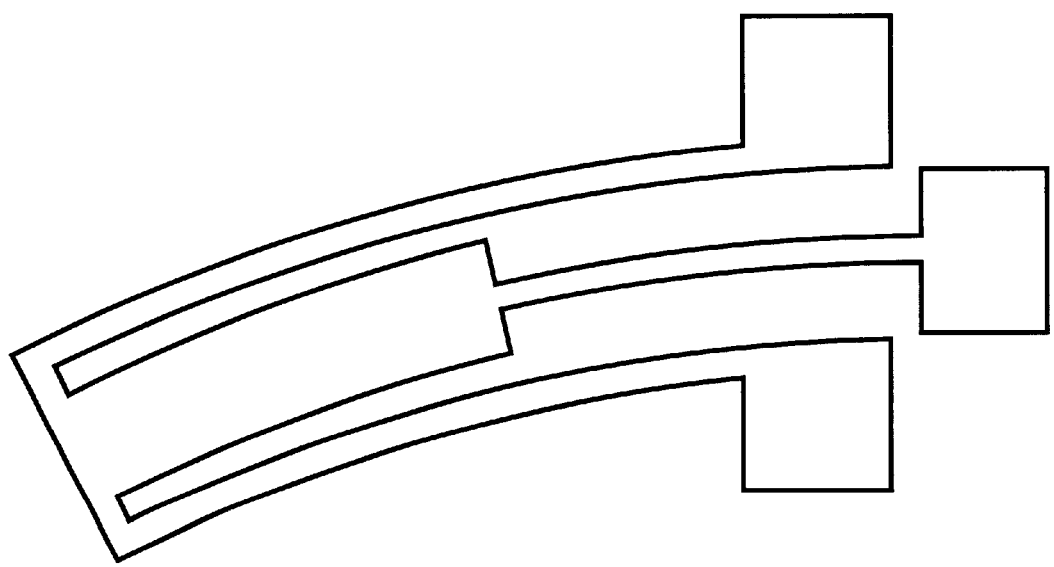
FIG. 3 shows the first exemplary embodiment of the thermal actuator according to this invention in a first deflected position.

The coupled ends 17, 27 and 37 can move and apply force in the direction of arrow B by the first current source 70 applying current to the first cantilever beam 10. The current applied by the first current source 70 causes the first cantilever beam 10 and the second cantilever beam 20 to heat up (the second cantilever beam 20 only heats up slightly). The first cantilever beam 10, being of smaller width than the second cantilever beam 20, has a higher current density than the current density of the second cantilever beam 20. The higher current density in the first cantilever beam 10 causes the first cantilever beam 10 to heat up and reach a higher temperature than, and thermally expand relative to, the second cantilever beam 20, which, in turn, causes the first cantilever beam 10 to move towards the second cantilever beam 20. The coupled ends 17, 27 and 37 of the first cantilever beam 10, the second cantilever beam 20, and the third cantilever beam 30, respectively, move in the direction of arrow B, resulting in the configuration shown in FIG. 3.

Figure 4:
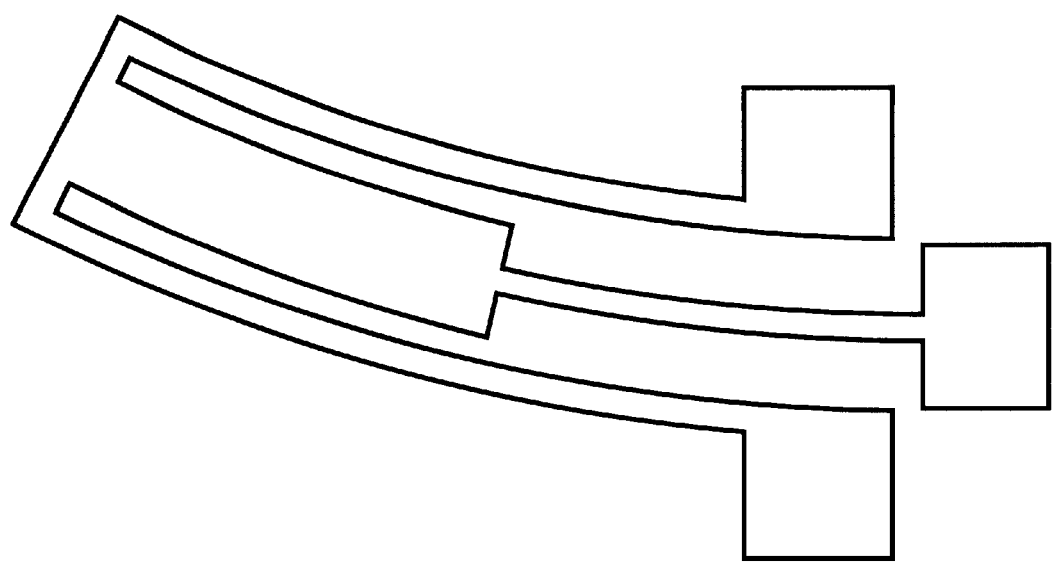
FIG. 4 shows the first exemplary embodiment of thermal actuator according to this invention in a second deflected position.

The coupled ends 17, 27 and 37 can move and apply force in the direction of arrow C by the second current source 80 applying current to the third cantilever beam 30. The current applied by the second current source 80 causes the third cantilever beam 30 and the second cantilever beam 20 to heat up (the second cantilever beam 20 only heats up slightly). The third cantilever beam 30, being of smaller width than the second cantilever beam 20, has a higher current density than the current density of the second cantilever beam 20. The higher current density of the third cantilever beam 30 causes the third cantilever beam 30 to heat up and reach a higher temperature than, and thermally expand relative to, the second cantilever beam 20, which, in turn, causes the third cantilever beam 30 to move towards the second cantilever beam 20. The coupled ends 17, 27 and 37 of the first cantilever beam 10, the second cantilever beam 20, and the third cantilever beam 30, respectively, move in the direction of arrow C, resulting in the configuration shown in FIG. 4.

The various exemplary embodiments of the thermal actuator according to this invention exhibit the same force and displacement values as those for the conventional thermal actuator. However, exemplary embodiments of the thermal actuator according to this invention can exert force in two directions without the need for two different types of materials. In addition, only a single "cold" arm is needed to apply force in two opposite directions.

There are numerous configurations and corresponding applications of the various exemplary embodiments of the thermal actuator according to this invention. For example, an array of single-material, bi-directional thermal actuators according to this invention can be used to increase the force a MEMS device can generate. Such an array can provide a precisely indexed motion of a moveable member such as a rotary gear or a rack over a small angle of rotation or over a small range of linear translation.

Conventionally, to achieve force in two directions, the number of conventional thermal actuators would have to be doubled, with the second set of thermal actuators placed for motion in the reverse direction. The second set of thermal actuators would sacrifice valuable chip space. The various exemplary embodiments of the bi-directional thermal actuator according to this invention obviates the need for a second set of thermal actuators, freeing up chip space for other components.

Figure 5:
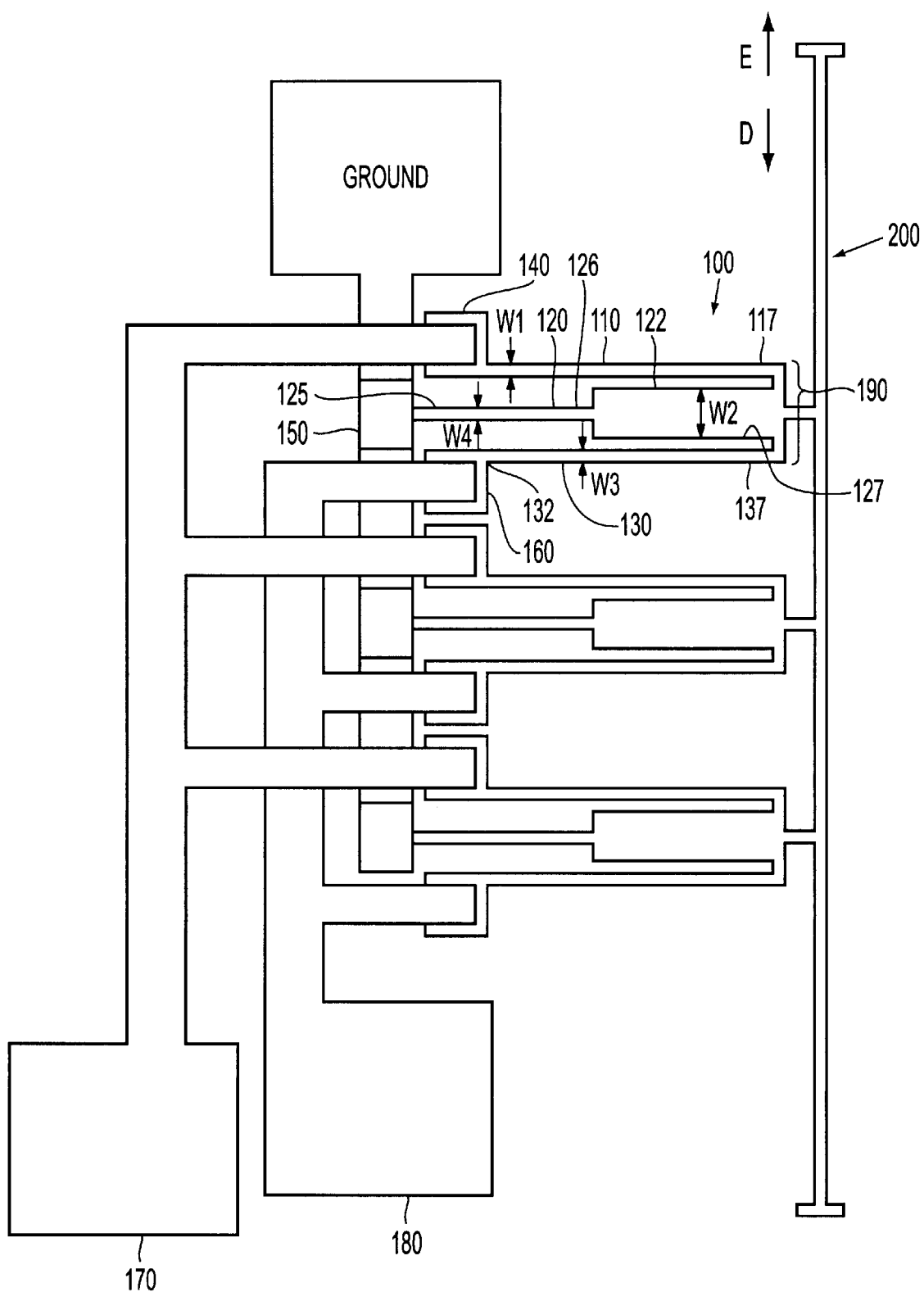
FIG. 5 shows a plurality of thermal actuators according to this invention arranged in an array.

FIG. 5 shows a plurality of thermal actuators 100 according to this invention arranged in an array. Although FIG. 5 shows three thermal actuators 100 arranged in an array, it should be appreciated that any number of thermal actuators can be used to form the array. Also, the array can include two or more columns of thermal actuators. Each thermal actuator 100 includes a first cantilever beam 110, a second cantilever beam 120, and a third cantilever beam 130. An anchor 140 couples the first cantilever beam 110 to the substrate at a proximal end 112 of the first cantilever beam 110. The first cantilever beam 110 has a distal end 117. The first cantilever beam 110 is electrically connected to a first current source 170 at the proximal end 112 of the first cantilever beam 110. An anchor 150 couples the second cantilever beam 120 to the substrate at a proximal end 125 of the second cantilever beam 120. The second cantilever beam 120 has a distal end 127. The second cantilever beam 120 is electrically connected to ground at the proximal end 125 of the second cantilever beam 120. An anchor 160 couples the third cantilever beam 130 to the substrate at the proximal end 132 of the third cantilever beam 130. The third cantilever beam 130 has a distal end 137. The third cantilever beam 130 is electrically connected to a second current source 180 at the proximal end 132 of the third cantilever beam 130. As in the first embodiment, the second cantilever beam 120 has a portion 122 having a width W2 that is wider than the width W1 of the first cantilever beam 110 and the width W3 of the third cantilever beam 130. The second cantilever beam 120 also has a portion 126 having a width W4. The widths W1, W3 and W4 are typically the same size. The distal end 117 of the first cantilever beam 110, the distal end 127 of the second cantilever beam 120, and the distal end 137 of the third cantilever beam 130 are coupled together to form a distal end 190 of thermal actuator 100. Each of the distal ends 190 can be coupled to an applicator 200, although the use of an applicator is not necessary. Although the applicator 200 is shown as a bar in FIG. 5, it should be appreciated that the applicator 200 could be of any shape or design. Further, in other embodiments, a single thermal actuator could be used to apply force through an applicator in two directions.

As in the first embodiment, the distal ends 190 can move and apply force to the applicator 200 in the direction of arrow D by the first current source 170 applying current to the first cantilever beam 110 in each of the thermal actuators 100. Also as in the first embodiment, the ends 190 can move and apply force to the applicator 200 in the direction of arrow E by the second current source 180 applying current to the third cantilever beams 130 in each of the thermal actuators 100.

While the invention has been described with reference to exemplary embodiments thereof, it is to be understood that the invention is not limited to the preferred, exemplary embodiments or constructions. To the contrary, the invention is intended to cover various modifications and equivalent arrangements. In addition, while the various elements of the exemplary embodiments are shown in various combinations and configurations, which are exemplary, other combinations and configurations, including more, less or only a single element, are also within the spirit and scope of the invention.

What is claimed is:

1. A thermal actuator comprising:
   a first arm having a proximal end and a distal end;
   a second arm, parallel to the first arm, and having a proximal end and a distal end;
   a third arm arranged between and parallel to the first and second arms, the third arm having a proximal end and a distal end, the third arm having at least one portion between the proximal end and the distal end of the third arm having a width that is substantially larger than a width of the first arm and a width of the second arm;
   the distal ends of the first, second and third arms are coupled together to form a distal end of the thermal actuator, and the first, second and third arms are made of a single material wherein:
   (a) when the proximal end of the third arm is coupled to ground and current is applied to the proximal end of the first arm, the distal end of the thermal actuator moves and applies force in a first direction, and (b) when the proximal end of the third arm is coupled to ground and current is applied to the proximal end of the second arm, the distal end of the thermal actuator moves and applies force in a direction opposite the first direction, and wherein the distal end of the thermal actuator moves in a plane containing the first, second and third arms.

2. The thermal actuator of claim 1, further comprising a substrate to which the proximal ends of the first, second and third arms are coupled.

3. The thermal actuator of claim 1, wherein the single material a layer of polysilicon.

4. The thermal actuator of claim 1, further comprising an applicator coupled to the distal end of the thermal actuator.

5. The thermal actuator of claim 1, wherein the applicator comprises a bar.

6. A microelectromechanical device comprising:
   the array of thermal actuators according to claim 1, wherein the distal ends of each of the thermal actuators are coupled to a common member.

7. The microelectromechanical device of claim 6, further comprising a substrate to which the proximal ends of each of the first, second and third arms are coupled.

8. The microelectromechanical device of claim 6, wherein the single material is a layer of polysilicon.

9. The microelectromechanical device of claim 6, wherein the distal end of each of the thermal actuators moves in a plane containing the first, second and third arms.

10. The microelectromechanical device of claim 6, wherein the common member is a bar.

11. A thermal actuator comprising:
    a first arm having a proximal end and a distal end;
    a second arm, parallel to the first arm, and having a proximal end and a distal end;
    a third arm arranged between and parallel to the first and second arms, the third arm having a proximal end and a distal end, the first, second and third arms are made of a single material;
    the distal ends of the first, second and third aims are coupled together to form a distal end of the thermal actuator wherein:
    (a) when the proximal end of the third arm is coupled to ground and current is applied to the proximal end of the first arm, the first arm thermally expands by an amount that is greater than an amount by which the third arm thermally expands whereby the distal end of the thermal actuator moves and applies force in a first direction, and (b) when the proximal end of the third arm is coupled to ground and current is applied to the proximal end of the second arm, the second arm thermally expands by an amount that is greater than an amount by which the third arm thermally expands, whereby the distal end of the thermal actuator moves and applies force in a direction opposite the first direction, and wherein the distal end of the thermal actuator moves in a plane containing the first, second and third arms.

12. The thermal actuator of claim 11, further comprising a substrate to which the proximal ends of the first, second and third arms are coupled.

13. The thermal actuator of claim 11, wherein the single material is a layer of polysilicon.

14. The thermal actuator of claim 11, wherein the third arm has a mass that is greater than a mass of the first arm and greater than a mass of the second arm.

15. The thermal actuator of claim 11, wherein the third arm has at least one portion between the proximal end and the distal end of the third arm having a thickness that is greater than a thickness of the first arm and greater than a thickness of the second arm.

16. A microelectromechanical device comprising:
an array of thermal actuators according to claim 11, wherein the distal ends of each of the thermal actuators are coupled to a common member.

17. A method of applying force in at least two opposite directions, comprising:
supplying current to a first arm of a thermal actuator such that the first arm heats up and longitudinally expands relative to a cold arm of the thermal actuator such that a distal end of the thermal actuator moves and applies a force to an object in a first direction; and alternatively, supplying current to a second arm of a thermal actuator such that the second arm heats up and longitudinally expands relative to the cold arm such that the distal end of the thermal actuator moves and applies a force to the object in a direction opposite to the first direction, wherein the distal end of the thermal actuator moves in a plane containing the first, second and cold aims.

18. A microelectromechanical device comprising the thermal actuator of claim 1.

* * * * *